United States Patent
Brennan, III et al.

(10) Patent No.: US 7,245,419 B2
(45) Date of Patent: Jul. 17, 2007

(54) WAVELENGTH-STABILIZED PUMP DIODES FOR PUMPING GAIN MEDIA IN AN ULTRASHORT PULSED LASER SYSTEM

(75) Inventors: James Francis Brennan, III, Austin, TX (US); Timothy J. Booth, West Melbourne, FL (US)

(73) Assignee: Raydiance, Inc., Orlando, FL (US)

( * ) Notice: Subject to any disclaimer, the term of this patent is extended or adjusted under 35 U.S.C. 154(b) by 0 days.

(21) Appl. No.: 11/233,634

(22) Filed: Sep. 22, 2005

(65) Prior Publication Data

US 2007/0064304 A1    Mar. 22, 2007

(51) Int. Cl.
*H01S 3/00*    (2006.01)
(52) U.S. Cl. ..................................... 359/333
(58) Field of Classification Search .............. 359/333
See application file for complete search history.

(56) References Cited

U.S. PATENT DOCUMENTS

| | | | |
|---|---|---|---|
| 3,631,362 A | 12/1971 | Almasi et al. |
| 3,808,549 A | 4/1974 | Maurer |
| 3,963,953 A | 6/1976 | Thornton, Jr. |
| 4,289,378 A | 9/1981 | Remy et al. |
| 4,718,418 A | 1/1988 | L'Esperance, Jr. |
| 4,722,591 A | 2/1988 | Haffner |
| 4,750,809 A | 6/1988 | Kafka et al. |
| 4,808,000 A | 2/1989 | Pasciak |
| 4,815,079 A | 3/1989 | Snitzer et al. |
| 4,824,598 A | 4/1989 | Stokowski |
| 4,829,529 A | 5/1989 | Kafka |
| 4,902,127 A | 2/1990 | Byer et al. |
| 4,913,520 A | 4/1990 | Kafka |
| 4,915,757 A | 4/1990 | Rando |
| 4,972,423 A | 11/1990 | Alfano et al. |
| 5,014,290 A | 5/1991 | Moore et al. |
| 5,022,042 A | 6/1991 | Bradley |

(Continued)

FOREIGN PATENT DOCUMENTS

EP    214100 A    3/1987

(Continued)

OTHER PUBLICATIONS

Limpert et al. All fiber chirped-pulse amplification system based on compression in air-guiding photonic band-gap fiber. Optics Express 3332. vol. 11, No. 24, Dec. 2003.*

(Continued)

*Primary Examiner*—Deandra M. Hughes
(74) *Attorney, Agent, or Firm*—Carr & Ferrell LLP

(57) ABSTRACT

In an optical amplifier, passively wavelength-stabilized pump diodes generate pumping light to excite a gain medium (e.g., rare-earth-ion doped optical fiber or solid-state optical amplifier) near an absorption peak of the gain medium. The gain medium amplifies a pulsed laser signal coupled into the gain medium to a high peak power with minimal non-linear distortion. The gain medium may include a portion configured to receive the pumping light and another portion configured to amplify the pulsed laser signal. A volume phase hologram device may passively wavelength stabilize the pump diodes by reflecting a portion of the pumping light back to the pump diodes. Passively wavelength-stabilizing the pump diodes improves power efficiency of the optical amplifier.

17 Claims, 3 Drawing Sheets

U.S. PATENT DOCUMENTS

| | | |
|---|---|---|
| 5,043,991 A | 8/1991 | Bradley |
| 5,132,996 A | 7/1992 | Moore et al. |
| 5,162,643 A | 11/1992 | Currie |
| 5,166,818 A | 11/1992 | Chase et al. |
| 5,187,759 A | 2/1993 | DiGiovanni et al. |
| 5,237,576 A | 8/1993 | DiGiovanni et al. |
| 5,265,107 A | 11/1993 | Delfyett, Jr. |
| 5,291,501 A | 3/1994 | Hanna |
| 5,302,835 A | 4/1994 | Bendett et al. |
| 5,313,262 A | 5/1994 | Leonard |
| 5,329,398 A | 7/1994 | Lai et al. |
| 5,367,143 A | 11/1994 | White, Jr. |
| 5,400,350 A | 3/1995 | Galvanauskas |
| 5,414,725 A | 5/1995 | Fermann et al. |
| 5,418,809 A | 5/1995 | August, Jr. et al. |
| 5,430,572 A | 7/1995 | DiGiovanni et al. |
| 5,440,573 A | 8/1995 | Fermann |
| 5,450,427 A | 9/1995 | Fermann et al. |
| 5,479,422 A | 12/1995 | Fermann et al. |
| 5,489,984 A | 2/1996 | Hariharan et al. |
| 5,499,134 A | 3/1996 | Galvanauskas et al. |
| 5,517,043 A | 5/1996 | Ma et al. |
| 5,548,098 A | 8/1996 | Sugawara et al. |
| 5,572,335 A | 11/1996 | Stevens |
| 5,572,358 A | 11/1996 | Gabl et al. |
| 5,585,652 A | 12/1996 | Kamasz et al. |
| 5,585,913 A | 12/1996 | Hariharan et al. |
| 5,592,327 A | 1/1997 | Gabl et al. |
| 5,596,668 A | 1/1997 | DiGiovanni et al. |
| 5,602,677 A | 2/1997 | Tournois |
| 5,617,434 A | 4/1997 | Tamura et al. |
| 5,627,848 A | 5/1997 | Fermann et al. |
| 5,633,750 A | 5/1997 | Nogiwa et al. |
| 5,633,885 A | 5/1997 | Galvanauskas et al. |
| 5,651,018 A | 7/1997 | Mehuys et al. |
| 5,656,186 A | 8/1997 | Mourou et al. |
| 5,663,731 A | 9/1997 | Theodoras, II et al. |
| 5,677,769 A | 10/1997 | Bendett |
| 5,689,519 A | 11/1997 | Fermann et al. |
| 5,696,782 A | 12/1997 | Harter et al. |
| 5,701,319 A | 12/1997 | Fermann |
| 5,703,639 A | 12/1997 | Farrier et al. |
| 5,708,669 A | 1/1998 | DiGiovanni et al. |
| 5,710,424 A | 1/1998 | Theodoras, II et al. |
| 5,720,894 A | 2/1998 | Neev et al. |
| 5,726,855 A | 3/1998 | Mourou et al. |
| 5,778,016 A | 7/1998 | Sucha et al. |
| 5,815,519 A * | 9/1998 | Aoshima et al. ............... 372/25 |
| 5,818,630 A | 10/1998 | Fermann et al. |
| 5,822,097 A | 10/1998 | Tournois |
| 5,847,863 A | 12/1998 | Galvanauskas et al. |
| 5,862,287 A | 1/1999 | Stock et al. |
| 5,867,304 A | 2/1999 | Galvanauskas et al. |
| 5,875,408 A | 2/1999 | Bendett et al. |
| 5,880,823 A | 3/1999 | Lu |
| 5,880,877 A | 3/1999 | Fermann et al. |
| 5,898,485 A | 4/1999 | Nati, Jr. |
| 5,907,157 A | 5/1999 | Yoshioka et al. |
| 5,920,668 A | 7/1999 | Uehara et al. |
| 5,923,686 A | 7/1999 | Fermann et al. |
| 5,936,716 A | 8/1999 | Pinsukanjana et al. |
| 6,014,249 A | 1/2000 | Fermann et al. |
| 6,020,591 A | 2/2000 | Harter et al. |
| 6,034,975 A | 3/2000 | Harter et al. |
| 6,061,373 A | 5/2000 | Brockman et al. |
| 6,072,811 A | 6/2000 | Fermann et al. |
| 6,075,588 A | 6/2000 | Pinsukanjana et al. |
| 6,081,369 A | 6/2000 | Waarts et al. |
| 6,120,857 A | 9/2000 | Balooch et al. |
| 6,122,097 A * | 9/2000 | Weston et al. ............... 359/345 |
| 6,130,780 A | 10/2000 | Joannopoulos et al. |
| 6,151,338 A | 11/2000 | Grubb et al. |
| 6,154,310 A | 11/2000 | Galvanauskas et al. |
| 6,156,030 A | 12/2000 | Neev |
| 6,181,463 B1 | 1/2001 | Galvanauskas et al. |
| 6,198,568 B1 | 3/2001 | Galvanauskas et al. |
| 6,208,458 B1 | 3/2001 | Galvanauskas et al. |
| 6,246,816 B1 | 6/2001 | Moore et al. |
| 6,249,630 B1 | 6/2001 | Stock et al. |
| 6,252,892 B1 | 6/2001 | Jiang et al. |
| 6,256,328 B1 | 7/2001 | Delfyett et al. |
| 6,269,108 B1 | 7/2001 | Tabirian et al. |
| 6,275,512 B1 | 8/2001 | Fermann |
| 6,281,471 B1 * | 8/2001 | Smart ................... 219/121.62 |
| 6,303,903 B1 | 10/2001 | Liu |
| 6,314,115 B1 | 11/2001 | Delfyett et al. |
| 6,327,074 B1 | 12/2001 | Bass et al. |
| 6,327,282 B2 | 12/2001 | Hammons et al. |
| 6,334,011 B1 | 12/2001 | Galvanauskas et al. |
| 6,335,821 B1 | 1/2002 | Suzuki et al. |
| RE37,585 E | 3/2002 | Mourou et al. |
| 6,355,908 B1 | 3/2002 | Tatah et al. |
| 6,362,454 B1 | 3/2002 | Liu |
| 6,365,869 B1 | 4/2002 | Swain et al. |
| 6,370,171 B1 | 4/2002 | Horn et al. |
| 6,404,944 B1 | 6/2002 | Wa et al. |
| 6,421,169 B1 | 7/2002 | Bonnedal et al. |
| 6,433,303 B1 | 8/2002 | Liu et al. |
| 6,433,305 B1 | 8/2002 | Liu et al. |
| 6,433,760 B1 | 8/2002 | Vaissie et al. |
| 6,501,590 B2 | 12/2002 | Bass et al. |
| 6,522,460 B2 | 2/2003 | Bonnedal et al. |
| 6,525,873 B2 | 2/2003 | Gerrish et al. |
| 6,526,327 B2 | 2/2003 | Kar et al. |
| 6,529,319 B2 | 3/2003 | Youn et al. |
| 6,549,547 B2 | 4/2003 | Galvanauskas et al. |
| 6,567,431 B2 | 5/2003 | Tabirian et al. |
| 6,573,813 B1 | 6/2003 | Joannopoulos et al. |
| 6,574,024 B1 | 6/2003 | Liu |
| 6,576,917 B1 | 6/2003 | Silfvast |
| 6,580,553 B2 | 6/2003 | Kim et al. |
| 6,597,497 B2 | 7/2003 | Wang et al. |
| 6,603,911 B2 | 8/2003 | Fink et al. |
| 6,621,045 B1 | 9/2003 | Liu et al. |
| 6,627,844 B2 | 9/2003 | Liu et al. |
| 6,642,477 B1 | 11/2003 | Patel et al. |
| 6,647,031 B2 | 11/2003 | Delfyett et al. |
| 6,654,161 B2 | 11/2003 | Bass et al. |
| 6,661,816 B2 | 12/2003 | Delfyett et al. |
| 6,671,298 B1 | 12/2003 | Delfyett et al. |
| 6,690,686 B2 | 2/2004 | Delfyett et al. |
| 6,710,288 B2 | 3/2004 | Liu et al. |
| 6,710,293 B2 | 3/2004 | Liu et al. |
| 6,720,519 B2 | 4/2004 | Liu et al. |
| 6,723,991 B1 | 4/2004 | Sucha et al. |
| 6,728,273 B2 * | 4/2004 | Perry ........................ 372/18 |
| 6,728,439 B2 | 4/2004 | Weisberg et al. |
| 6,735,229 B1 | 5/2004 | Delfyett et al. |
| 6,738,144 B1 | 5/2004 | Dogariu |
| 6,744,555 B2 | 6/2004 | Galvanauskas et al. |
| 6,749,285 B2 | 6/2004 | Liu et al. |
| 6,760,356 B2 * | 7/2004 | Erbert et al. ................... 372/93 |
| 6,774,869 B2 | 8/2004 | Biocca et al. |
| 6,782,207 B1 | 8/2004 | Efimov |
| 6,785,303 B1 * | 8/2004 | Holzwarth et al. ........... 372/16 |
| 6,787,734 B2 | 9/2004 | Liu |
| 6,788,864 B2 | 9/2004 | Ahmad et al. |
| 6,791,060 B2 | 9/2004 | Dunsky et al. |
| 6,801,551 B1 | 10/2004 | Delfyett et al. |
| 6,803,539 B2 | 10/2004 | Liu et al. |
| 6,804,574 B2 | 10/2004 | Liu et al. |
| 6,807,375 B2 | 10/2004 | Dogariu |
| 6,815,638 B2 | 11/2004 | Liu |
| 6,819,694 B2 | 11/2004 | Jiang et al. |

| | | | |
|---|---|---|---|
| 6,819,702 | B2 | 11/2004 | Sverdlov et al. |
| 6,819,837 | B2 | 11/2004 | Li et al. |
| 6,822,251 | B1 | 11/2004 | Arenberg et al. |
| 6,829,517 | B2 | 12/2004 | Cheng et al. |
| 6,878,900 | B2 | 4/2005 | Corkum et al. |
| 6,885,683 | B1* | 4/2005 | Fermann et al. ............... 372/25 |
| 6,897,405 | B2 | 5/2005 | Cheng et al. |
| 6,917,631 | B2* | 7/2005 | Richardson et al. ........... 372/5 |
| 7,088,756 | B2* | 8/2006 | Fermann et al. ....... 372/45.013 |
| 2002/0176676 | A1 | 11/2002 | Johnson et al. |
| 2003/0202547 | A1* | 10/2003 | Fermann et al. ............... 372/6 |
| 2004/0231682 | A1 | 11/2004 | Stoltz |
| 2005/0008044 | A1* | 1/2005 | Fermann et al. ............... 372/19 |
| 2005/0035097 | A1 | 2/2005 | Stoltz |
| 2005/0038487 | A1 | 2/2005 | Stoltz |
| 2005/0061779 | A1 | 3/2005 | Blumenfeld et al. |
| 2005/0065502 | A1 | 3/2005 | Stoltz |
| 2005/0074974 | A1 | 4/2005 | Stoltz |
| 2005/0077275 | A1 | 4/2005 | Stoltz |
| 2005/0127049 | A1 | 6/2005 | Woeste et al. |
| 2005/0163426 | A1* | 7/2005 | Fermann et al. ............... 385/37 |
| 2005/0167405 | A1 | 8/2005 | Stoltz et al. |
| 2005/0171516 | A1 | 8/2005 | Stoltz |
| 2005/0171518 | A1 | 8/2005 | Stoltz et al. |
| 2005/0175280 | A1* | 8/2005 | Nicholson .................... 385/27 |
| 2005/0177143 | A1 | 8/2005 | Bullington et al. |
| 2005/0195726 | A1 | 9/2005 | Bullington et al. |
| 2005/0226278 | A1* | 10/2005 | Gu et al. ........................ 372/6 |
| 2005/0226286 | A1* | 10/2005 | Liu et al. ....................... 372/25 |
| 2005/0238070 | A1* | 10/2005 | Imeshev et al. ............... 372/21 |
| 2006/0056480 | A1* | 3/2006 | Mielke et al. ................ 372/94 |
| 2006/0120418 | A1* | 6/2006 | Harter et al. .................. 372/30 |
| 2006/0126679 | A1* | 6/2006 | Brennan et al. ............... 372/30 |

FOREIGN PATENT DOCUMENTS

| | | |
|---|---|---|
| JP | 2003181661 A | 7/2003 |
| WO | WO 9428972 A1 | 12/1994 |
| WO | WO 2004/105100 A2 | 12/2004 |
| WO | WO 2004/114473 A2 | 12/2004 |
| WO | WO 2005/018060 A2 | 2/2005 |
| WO | WO 2005/018061 A2 | 2/2005 |
| WO | WO 2005/018062 A2 | 2/2005 |
| WO | WO 2005/018063 A2 | 2/2005 |

OTHER PUBLICATIONS

Price et al. Advances in High Power, short pulse, fiber laser systems and technology. Photonics West 2005. pp. 5709-5730. Jan. 2005.*

U.S. Appl. No. 10/916,368, Richard Stoltz, Pulse Energy Adjustment for Changes in Ablation Spot Size, filed Aug. 11, 2004.

U.S. Appl. No. 11/057,867, Michael Marshall Mielke, Method of Generating an Ultra-Short Pulse Using a High-Frequency Ring Oscillator, filed Feb. 13, 2005.

U.S. Appl. No. 11/057,868, Michael Marshall Mielke, Amplifying of high Energy Laser Pulses, filed Feb. 13, 2005.

U.S. Appl. No. 11/224,867, Peter Delfyett, Laser Ablation Method and Apparatus Having a Feedback Loop and Control Unit, filed Sep. 12, 2005.

U.S. Appl. No. 11/112,256, James F. Brennan, III, Bragg Fibers in Systems for the Generation of High Peak Power Light, filed Apr. 22, 2005.

U.S. Appl. No. 11/229,302, Michael Marshall Mielke, Actively Stabilized Systems for the Generation of Ultrashort Optical Pulses, filed Sep. 15, 2005.

U.S. Appl. No. 10/916,365, Richard Stoltz, Ablative Material Removal with a Preset Removal Rate or Volume or Depth, filed Aug. 11, 2005.

Yeh et al., "Theory of Bragg Fiber", Journal of the Optical Society America, Sep. 1978, pp. 1196, vol. 68, No. 9.

Engeness et al., "Dispersion Tailoring and Compensation by Model Interations in Omniguide Fibers," Optics Express, May 19, 2003, pp. 1175-1196, vol. 11, No. 10.

Fink et al., "Guiding Optical Light in Air Using an All-Dielectric Structure," Journal of Lightwave Technology, Nov. 1999, pp. 2039-2041, vol. 17, No. 11.

Siegman, "Unstable Optical Resonators", Applied Optics, Feb. 1974, pp. 353-367, vol. 13, No. 2.

Koechner, "Solid State Laser Engineering", Oct. 29, 1999, Section 5.5, pp. 270-277, 5th Edition, Springer.

Chen et al. "Dispersion-Managed Mode Locking", Journal of the Optical Society of America B, Nov. 1999, pp. 1999-2004, vol. 16, No. 11, Optical Society of America.

Resan et al. "Dispersion-Managed Semiconductor Mode-Locked Ring Laser", Optics Letters, Aug. 1, 2003, pp. 1371-1373, vol. 28, No. 15, Optical Society of America.

Dasgupta, S. et al., "Design of Dispersion-Compensating Bragg Fiber with an Ultrahigh Figure of Merit," Optics Letters, Aug. 1, 2005, vol. 30, No. 15, Optical Society of America.

Mohammed, W. et al., "Selective Excitation of the TE01 Mode in Hollow-Glass Waveguide Using a Subwavelength Grating," IEEE Photonics Technology Letters, Jul. 2005, vol. 17, No. 7, IEEE.

Delfyett, P et al., "Ultrafast Semiconductor Laser-Diode-Seeded Cr:LiSAF Rengerative Amplifier System", Applied Optics, May 20, 1997, pp. 3375-3380, vol. 36, No. 15, Octoical Society of America.

Levy et al., "Engineering Space-Variant INhomogenous Media for Polarization Control," Optics Letters, Aug. 1, 2004, pp. 1718-1720, vol. 29, No. 15, Optical Society of America.

Ibanescu et al., "Analysis of Mode Structure in Hollow Dielectric Waveguide Fibers," Physical Review E 67, 2003, The American Physical Society.

* cited by examiner

WAVELENGTH-STABILIZED PUMP DIODES FOR PUMPING GAIN MEDIA IN AN ULTRASHORT PULSED LASER SYSTEM

BACKGROUND

1. Field of the Invention

This disclosure relates to optical amplifiers, and, in particular to wavelength-stabilized pump diodes for pumping gain media in an ultrashort (e.g., chirped) pulsed laser system.

2. Description of the Prior Art

FIG. 1 illustrates an optical amplifier 100 in accordance with the prior art. The optical amplifier 100 includes an actively wavelength-stabilized pump 110, a combiner 120, and a gain fiber 130. The pump 110 provides a continuous-wave pumping light at a relatively constant wavelength that is coupled by the combiner 120 into the gain fiber 130. The gain fiber 130 is energized by the pumping light and thereby amplifies a laser signal 140 directed through the combiner 120 into the gain fiber 130. The gain fiber 130 fiber typically yields small-signal gains of commonly around 10 dB to 35 dB for the optical amplifier 100.

To produce the pumping light, the pump 110 comprises one or more pump diodes 150 coupled by a single-mode optical fiber to a fiber Bragg grating 155. The fiber Bragg grating 155 is slightly reflective (e.g., 1%–3%) so that a small amount of pumping light generated by the pump diodes 150 at the appropriate wavelength is reflected back into the pump diodes 150. The pump diodes 150 enter a coherence collapse regime, whereby instead of emitting a single laser spectral line that mode hops (i.e. changes wavelength) and fluctuates in power at the output of the pump diodes 150, the pumping light is a relatively stable wavelength with a shaped characteristic (e.g., square, rounded, etc.) due to the fiber Bragg grating 155.

A limitation with the optical amplifier 100 is that the pump diodes 150 generally drift in wavelength with temperature and drive current. Because the peak absorption of the gain fiber 130 may be fairly narrow spectrally, if the pump diodes 150 drift slightly off-wavelength by as little as a few nanometers, then the gain and output power of the optical amplifier 100 is reduced. The resulting drift or shift in wavelength of the output of the pump diodes 150 significantly reduces output power and power efficiency of the optical amplifier 100. If one wishes to excite the gain fiber 130 at a wavelength that does not correspond to its peak absorption, then one must use longer lengths of gain fiber 130 to achieve similar gain in the optical amplifier 100 as when the peak absorption of the gain fiber 130 is excited by the pump diodes 150.

Therefore, in the conventional optical amplifier 100, temperature of the pump diodes 150 must be maintained within a few degrees of a desired operating temperature in order for the wavelength of the pumping light to remain fairly stable. For example, with a temperature coefficient of drift of the pump diodes 150 of typically 0.3 nm/degree Kelvin (K), then if the temperature of the pump diodes 150 is allowed to drift by 10 degrees then the wavelength of the pumping light from the pump 110 may drift by 3 nm.

Consequently, to improve temperature and current stability and reduce wavelength drift of the pumping light, the pump 110 conventionally includes a temperature and/or current control 160. The temperature and/or current control 160 may include a water chiller and heat exchanger or thermoelectric converters (TEC elements or Peltier devices) for keeping the pump diodes 150 at a fairly constant temperature.

One limitation with water chillers is that chillers are relatively large bulky devices that increase the size and power draw of the optical amplifier 100. TEC elements are generally very expensive, relatively inefficient, and consume large amounts of power. TEC elements typically consume three times more energy than the amount of heat energy to be removed from the pump diodes 150. For example, to remove 5 watts of heat energy from the pump diodes 150, the TEC elements may require 15 watts of power.

The pump diodes 150 themselves are generally not highly efficient, typically converting only 25–50% of consumed power to pumping light output. For example, with 100 watts of electricity into the pump diodes 150, only about 28 watts of pumping light may be generated by the pump diodes 150. Furthermore, the gain fiber 130 has a relatively low conversion efficiency, with typically only 20% of the light input converted to the desired wavelength.

Therefore, including other inefficiencies in the system of which the optical amplifier 100 is merely one component, overall efficiency of the system can be as low as 1%. For example, for a 10 watt laser light output, the system may require 1 kilowatt of electrical power input. The remaining 990 watts of energy is converted into heat, which is a very inefficient conversion of electrical energy to useful laser light output from the system. The overall power-to-light conversion efficiency (also referred to as power or plug efficiency) of the optical amplifier 100 is relatively low, and the plug efficiency of the optical amplifier 100 is further reduced by the temperature and/or current control 160.

SUMMARY OF THE INVENTION

In one aspect, a system for optical amplification comprises one or more passively wavelength-stabilized pump diodes configured to generate pumping light, a gain medium configured to be excited by the pumping light near an absorption peak of the gain medium, and an output section. The gain medium is further configured to amplify a pulsed laser signal coupled into the gain medium to a high peak power with minimal non-linear distortion. The output section is configured to process the amplified pulsed laser signal to result in an ultrashort pulse of light In some embodiments, the system may comprise a volume phase hologram device configured to wavelength-stabilize the one or more pump diodes by reflecting a portion of the pumping light back to the one or more pump diodes. The absorption peak of the gain medium may span a narrower wavelength range than results from the wavelength drift of non-wavelength-stabilized pump diodes with temperature or current variations. The gain medium may comprise a solid-state optical medium, a multimode optical fiber, a photonic bandgap optical fiber, or a rare-earth-ion doped optical fiber.

In another aspect, a method comprises generating a pumping light from a laser device, reflecting a portion of the pumping light back to the laser device to result in a passively wavelength-stabilized pumping light, coupling the passively wavelength-stabilized pumping light into a gain medium near an absorption peak of the gain medium, amplifying a pulsed laser signal to a high peak power with minimal non-linear distortion in the gain medium, and processing the amplified pulsed laser signal to result in an ultrashort pulse of light.

In a further aspect, a system for optical amplification comprises one or more passively wavelength-stabilized pump diodes configured to generate pumping light, a gain medium comprising a first portion and a second portion, and an output section. The gain medium is configured to receive the pumping light near an absorption peak of the gain medium into the first portion and amplify to a high peak power pulsed laser light coupled into the second portion of the gain medium. The output section is configured to process the amplified pulsed laser light to result in an ultrashort athermally-ablative pulse of light.

In some embodiments, the gain medium comprises a multimode optical fiber less than about five meters in length. The gain medium may comprise a double clad optical fiber in which the first portion comprises an outer core of the optical fiber and the second portion comprises an inner core of the optical fiber. The inner and/or outer cores of the optical fiber may be multimode.

In a further aspect, a pulse amplification system comprises one or more pump diodes configured to generate a pumping light, a passive optical device configured to wavelength-stabilize the pumping light by reflecting a portion of the pumping light back to the one or more pump diodes, a laser seed source configured to generate an ultrashort pulsed signal, a pulse stretcher configured to stretch the ultrashort pulsed signal, a gain medium excited by the pumping light near an absorption peak of the gain medium and configured to amplify the stretched pulsed signal, and an output stage configured to compress the amplified stretched pulsed signal to result in an ultrashort athermally-ablative pulse of light.

In general, passively wavelength-stabilizing the pump diodes, provides improved power efficiency of the optical amplifier and the pulsed amplification system. Another advantage is higher peak power by operating the gain medium of the optical amplifier near a fairly narrow peak on the absorption spectrum of the gain medium.

BRIEF DESCRIPTION OF DRAWINGS

The present invention will now be described with reference to drawings that represent a preferred embodiment of the invention. In the drawings, like components have the same reference numerals. The illustrated embodiment is intended to illustrate, but not to limit the invention. The drawings include the following figures.

DETAILED DESCRIPTION

As described further herein, passively wavelength-stabilized pump diodes in an optical amplifier generate pumping light to excite a gain medium near an absorption peak of the gain medium. The gain medium amplifies a pulsed laser signal coupled into the gain medium to a high peak power. A volume phase hologram device may passively wavelength stabilize the pump diodes by reflecting a portion of the pumping light back to the pump diodes.

In general, one advantage of passively wavelength-stabilizing the pump diodes is improved power efficiency of the optical amplifier and the system of which the optical amplifier is merely one component, since one does not have to actively stabilize the wavelength of the pump diodes. Another advantage is higher peak power out of the system with low optical nonlinear-induced distortions by operating the gain medium of the optical amplifier at its maximum absorption, which may be a fairly narrow peak on the absorption spectrum of the gain medium.

Figure 1:
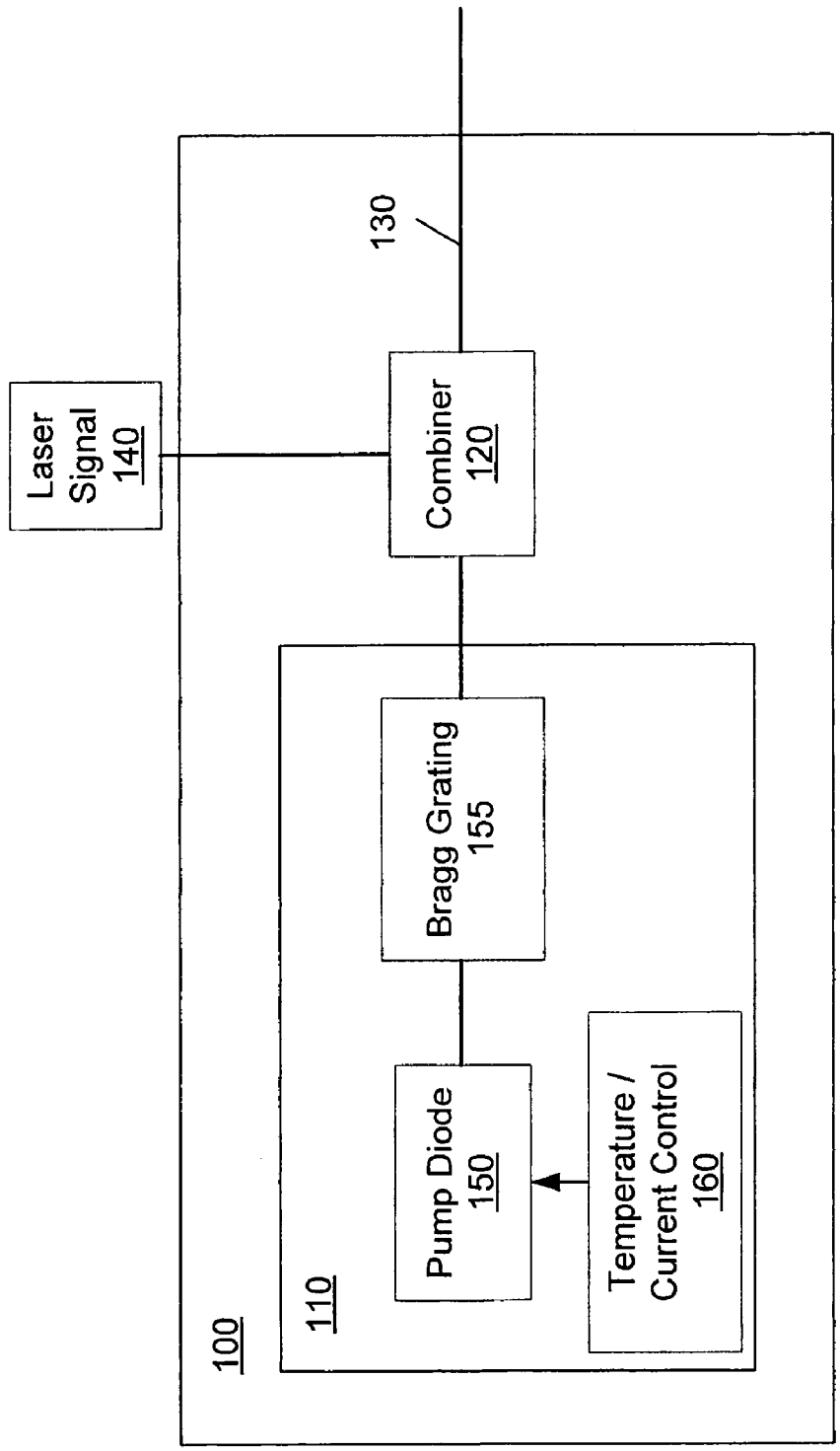
FIG. 1 illustrates an optical amplifier in accordance with the prior art.
Figure 2:
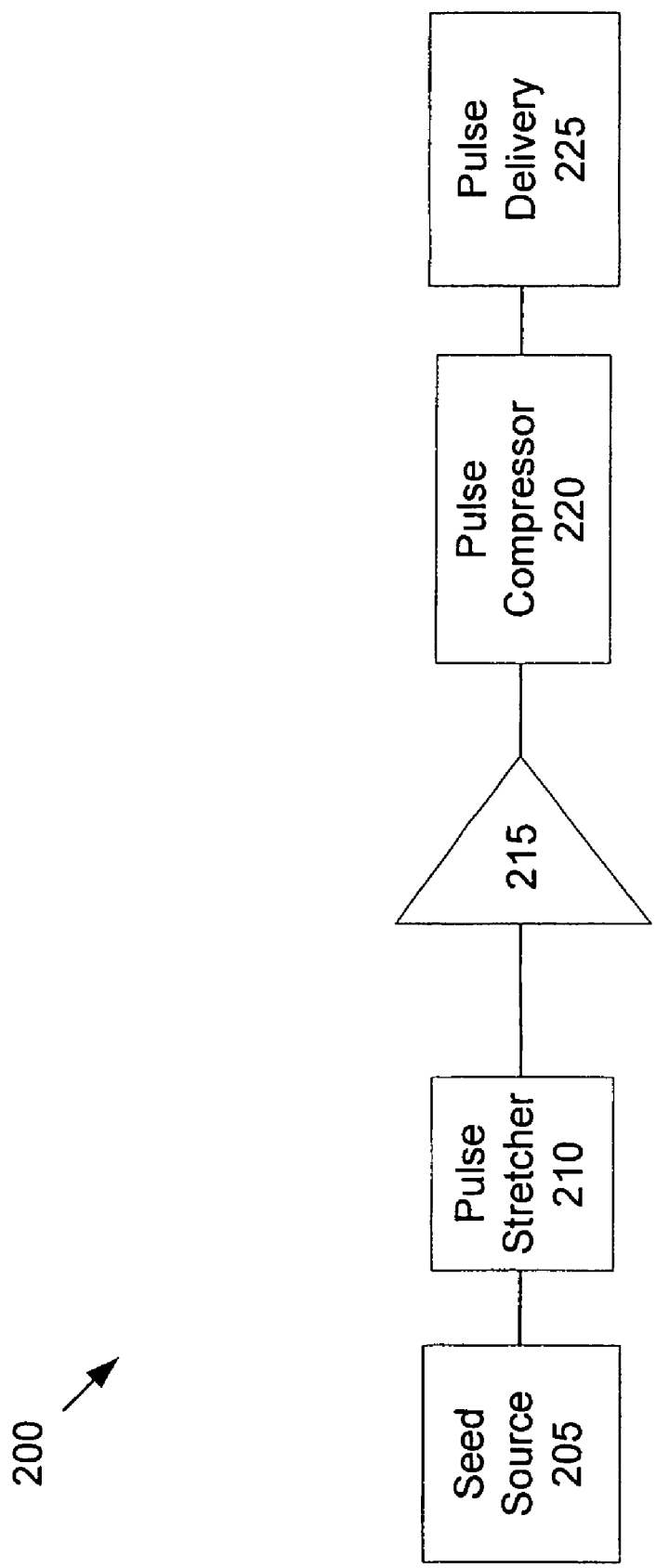
FIG. 2 illustrates a chirped pulse amplification (CPA) system, in one embodiment in accordance with the present invention.

FIG. 2 illustrates a chirped pulse amplification (CPA) system 200, in one embodiment in accordance with the present invention. The CPA system 200 includes a seed source 205, a pulse stretcher 210, a high peak power optical amplifier 215, a pulse compressor 220, and a pulse delivery component 225. The CPA system 200 produces ultrashort duration high-intensity pulses by chirped pulse amplification.

Although the instant invention will be described with reference to the CPA system 200, which may be utilized for athermal ablation with the ultrashort high-intensity pulses, it will be readily appreciated by skilled artisans that the high-intensity ultrashort pulses described herein need not be utilized for ablation, and the invention is not to be limited thereby. That is, the principles disclosed herein for generating ultrashort duration high-intensity pulses may be utilized in a CPA system for athermal ablation, but may find use in other applications.

While definitions vary, in general "ultrashort" generally refers to optical pulses of a duration less than approximately 10 psec, and this definition is used herein. Ultrashort light pulses are generated at low pulse energies (typically <1 nanojoule) through the use of a mode-locked laser oscillator or seed source 205. Some embodiments of the seed source 205 are further delineated in co-pending U.S. patent application Ser. No. 11/229,302 entitled "Actively Stabilized Systems for the Generation of Ultrashort Optical Pulses" filed Sep. 15, 2005 which is incorporated by reference as if set forth fully herein.

The duration of the ultrashort pulses from the seed source 205 is then increased by dispersing the pulses temporally as a function of wavelength (also referred to as "stretching" or "chirping" to lengthen the pulses in time) in the pulse stretcher 210. The pulse stretcher 210 comprises a dispersive delay line such as a silica optical fiber or a diffraction-grating arrangement (e.g. fiber Bragg grating). The dispersive delay line stretches the pulses temporally by orders of magnitude, for example from less than 100 femtoseconds to ~100 picoseconds. Stretching the pulses decreases the peak power of the chirped pulses by the stretch factor, approximately 3 orders of magnitude in this example.

Figure 3:
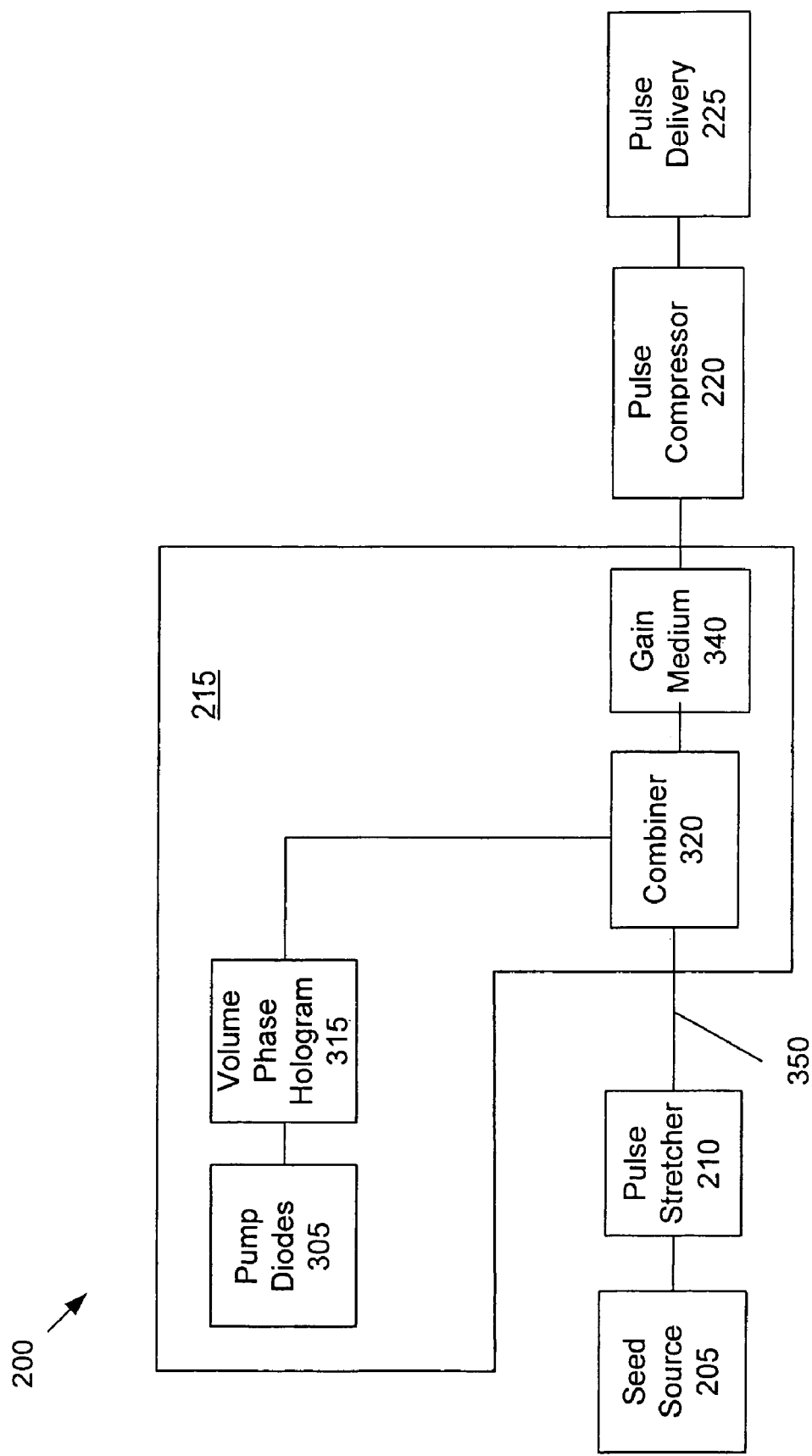
FIG. 3 illustrates further detail of the high peak power optical amplifier of the CPA system of FIG. 2, in one embodiment in accordance with the present invention.

The chirped pulses are amplified in the high peak power optical amplifier 215 (described further with respect to FIG. 3). The amplified chirped pulses are then compressed in the pulse compressor 220 to significantly shorten the duration of the pulses to near the duration of the pulses at the output of the seed source 205. The compression may be done with bulk optical elements involving prism and grating pairs, for example. The pulse delivery component 225 then provides the amplified pulses to a work surface to be ablated, for example.

The pulse compressor 220 and the pulse delivery component 225 may be considered as an output stage configured to process and compress the amplified pulses to result in ultrashort high intensity pulses of light. In the embodiment of FIG. 2, the pulse compressor 220 and the pulse delivery component 225 may provide ultrashort high-intensity pulses of light for use in athermal ablation of various materials, for example.

An advantage of the CPA system 200 is that by chirping the pulses, the optical amplifier 215 can increase the energy of the pulses with minimal nonlinear distortion to a high peak power that is well below a level that can cause damage to the optical amplifier 215. Specifically, energy can be efficiently extracted from a gain medium in the optical amplifier 215 with minimal nonlinear distortion, while the peak power levels of the stretched pulses are kept below the damage threshold of the gain medium. The CPA technique of the CPA system 200 is particularly useful for efficient utilization of solid-state optical gain media with high stored energy densities in the optical amplifier 215, where full amplification of non-chirped short pulses may not be possible because the peak power of the pulses is above the nonlinear distortion or damage thresholds of the optical amplifier 215 materials.

FIG. 3 illustrates further detail of the high peak power optical amplifier 215 of the CPA system 200 of FIG. 2, in one embodiment in accordance with the present invention. The optical amplifier 215 includes one or more pump diodes 305, a volume phase hologram 315 configured to passively wavelength-stabilize the pump diodes 305, a combiner 320, and a gain medium 340.

Heretofore, passive wavelength-stabilization has not been realized in a high power CPA system such as the CPA system 200. Wavelength-stabilization has been used in the past for stabilizing pump diodes, but not the high power pump diodes in a CPA system. Pump diodes in a high-power CPA system optical amplifier are typically coupled into multi-mode fiber that cannot be used with traditional passive wavelength-stabilization devices such as a fiber Bragg grating. Therefore, it was conventionally assumed that pump diodes in an amplifier of a CPA system needed to be controlled by active temperature and/or current control, and not use a fiber Bragg grating to passively wavelength-stabilize the pump diodes.

Further, in a conventional CPA system with a commonly used erbium-ytterbium or erbium or ytterbium doped optical fiber gain medium, the pump diodes are typically tuned to generate pumping light over the wavelength range 930 nm to 940 nm, a relatively wide absorption domain. Pumping at 930–940 nm at the relatively wide absorption domain reduces the requirement for wavelength-stabilization of the pump diodes. However, pumping at the wide absorption domain requires a relatively long fiber for the gain medium (on the order of 5 meters), which increases the nonlinear distortions induced in the amplified signal at high peak powers.

A limitation with pumping at the wide absorption domain is that, in a CPA system, the longer the gain medium the lower the peak power must be Nonlinear effects in the gain medium can cause length-dependent distortions of a pulse being amplified in the gain medium.

One reason that a long fiber gain medium reduces peak power of a pulse in a CPA system is that pulse amplification and propagation within the fiber gain medium may activate one or more nonlinear responses of the fiber gain medium owing to the high peak power of the short laser pulses. Chief among these nonlinear effects are self-phase modulation (SPM) and stimulated Raman scattering (SRS).

SPM generally widens the spectrum and distorts phasing of the wave in the fiber gain medium. SRS generally shifts the wavelength of a portion of the pulsed laser signal to be amplified to a longer color, causing a longer-wavelength shift in the laser signal to an undesired wavelength and separating that energy from the original laser signal. SPM can cause pulse spectrum breakup, self focusing, and catastrophic failure in the fiber gain medium. Both effects distort the pulsed laser signal and can impair or completely prevent pulse compression after amplification.

As described further herein, power amplification of a pulsed laser signal 350 from the seed source 205 and pulse stretcher 210 in the optical amplifier 215 is generated by pumping the gain medium 340 with a passively wavelength-stabilized pumping light from the pump diodes 305 and the volume phase hologram 315. The pumping light is tuned to a relatively narrow absorption peak of the gain medium 340 to provide relatively high efficiency amplification in the gain medium 340 and reduce or eliminate the possibility of damage of the gain medium 340 with high peak power.

Pumping at a narrow absorption peak improves the optical to optical conversion efficiency of the gain medium 340, so that for a given pulse energy at the output, the gain medium 340 can be shorter. Since the onset of non-linear effects is a function of length of the gain medium 340, for a given output energy per pulse, higher peak power can be tolerated in a shorter gain medium 340. Further, tuning the pumping light to a relatively narrow absorption peak of the gain medium 340 reduces or eliminates the effect of nonlinear distortion in the gain medium 340.

Considering first the gain medium 340, the gain medium 340 is described further herein by way of an exemplary embodiment, although persons of ordinary skill will recognize that there are many materials and configurations for the gain medium 340. For example, the gain medium 340 may comprise double clad optical fiber, solid-state optical gain medium, photonic bandgap optical fiber, and optical fiber doped with rare-earth-ions such as erbium and/or ytterbium.

A generic characteristic of these many materials and configurations is that the gain medium 340 comprises a first portion that receives the passively wavelength-stabilized pumping light near an absorption peak of the gain medium 340 and amplify a pulsed laser signal 350 coupled into a second portion of the gain medium 340. The gain medium 340 amplifies the pulsed laser signal 350 to a high peak power with minimal non-linear distortion.

For example, a solid-state optical gain medium 340 can be considered to have a first portion and a second portion. Into the first portion, the passively wavelength-stabilized pumping light is either end pumped (coaxially with respect to the pulsed laser signal 350), radially pumped (perpendicular to the pulsed laser signal 350 from multiple directions) or side pumped (perpendicular to the pulsed laser signal 350 from one direction). The second portion comprises the portion of the solid-state optical gain medium 340 (e.g., the end) into which the pulsed laser signal 350 is coupled for amplification.

The gain medium 340 of the exemplary embodiment comprises double clad optical fiber of less than 5 meters in length, preferably erbium-ytterbium doped optical fiber with 25 um core and fiber length of 1.7 meters. The double clad optical fiber includes an inner core (inner portion, not shown) doped with erbium-ytterbium rare-earth-ions and a concentric non-doped outer core (outer portion, not shown).

The pulsed laser signal 350 is coupled by the combiner 320 into the inner core of the gain medium 340. The pumping light from the pump diodes 305 and volume phase hologram 315 is coupled by the combiner 320 into the outer core of the gain medium 340. The outer core of the gain medium 340 acts as a waveguide that traps and guides the pumping light along the length of the inner core. The pumping light in the outer core is eventually absorbed by the inner core of the gain medium 340 and used to amplify the pulsed laser signal 350.

If the gain medium 340 is ytterbium-doped silica glass, the absorption spectrum of the gain medium 340 exhibits a fairly narrow absorption peak at 976 nm, equivalent to about 3 times more absorption as compared to a relatively wider absorption domain at 930–940 nm. Because the gain medium 340 exhibits a narrow absorption peak at 976 nm, the gain medium 340 has a relatively short fiber length of 1.7 meters (as compared to a relatively longer fiber of at least about 5 meters that would be required if the gain medium 340 was pumped at 930–940 nm as is done for example in a conventional CPA system). The short fiber length is possible by increasing the length-dependent absorption of the gain medium by exciting it at its peak absorption. The short fiber length minimizes nonlinear distortions such as SPM and SRS in the gain medium 340.

However, because of the narrow absorption peak at 976 nm, if the pump diodes 305 drift slightly off of the 976 nm wavelength even by as little as +/−3 nm, then the gain of the optical amplifier 215 would be significantly reduced along with the output power and efficiency of the CPA system 200.

Accordingly, the pump diodes 305 and volume phase hologram 315 are configured to generate passively wavelength-stabilized pumping light at a wavelength of 976 nm. The volume phase hologram 315 is configured to reflect a portion of the pumping light back to the pump diodes 305 to at the appropriate 976 nm wavelength. The volume phase hologram 315 of one embodiment comprises a LuxxMaster® Wavelength Stabilizer, available from PD-LD, Inc., of Pennington, N.J. The volume phase hologram 315 is usable with multimode fiber gain media such as the gain medium 340 of the exemplary embodiment.

Passive wavelength-stabilization by reflection of a portion of the output of the pump diodes 305 back to the pump diodes 305 results in stability of 0.01 nm/K as compared to non-stabilized drift of the pump diodes 305 of +/3 nm/degree K. With passive wavelength-stabilization, the pump diodes 305 may be operated over a 30 degree temperature range, for example, yet still provide only 3 nm of drift in the output frequency of the pump diodes 305. For example, controlling the pump diodes 305 within a 5–10 degree K temperature range may be performed with cooling fans and/or cooling fins (not shown), which are significantly smaller in size and less expensive in cost than water chillers or TEC devices. Cooling fans and/or cooling fins are considered as passive devices because there is no active control over the temperature and/or current of the pump diodes 305.

Therefore, an advantage of operating the pump diodes 305 at or near an absorption peak of the gain medium 340 is shorter length in the gain medium 340 (e.g., less fiber). Pumping the gain medium 340 at or near an absorption peak reduces nonlinear distortion in the gain medium 340, yielding relatively higher peak power in the gain medium 340 and higher energy per pulse at the output of the CPA system 200.

Furthermore, eliminating the water chillers or TEC devices increases plug efficiency of the CPA system 200. Although such temperature and/or current control devices may be utilized in the CPA system 200, the passive wavelength-stabilization technique described herein reduces or eliminates the need for such active wavelength-stabilization methods. Providing passive wavelength-stabilization in the CPA system 200 allows significant reductions in the physical size, power consumption, and power efficiency of the CPA system 200.

OTHER EMBODIMENTS

In various alternative embodiments, the CPA system 200 incorporates other types of the gain medium 340 and/or operation at other narrow absorption peaks. For example, the gain medium 340 may comprise an erbium-doped fiber pumped at 1480 nm. Accordingly, the scope of the invention is considered to include erbium-ytterbium fiber, ytterbium fiber, and other gain media such as solid-state gain media with different absorption characteristics for the gain media 340. Further, the CPA system 200 may incorporate large mode field fiber for the gain medium 340 to further reduce nonlinearities or further minimize fiber length.

The invention has been described herein in terms of preferred embodiments. Other embodiments of the invention, including alternatives, modifications, permutations and equivalents of the embodiments described herein, will be apparent to those skilled in the art from consideration of the specification, study of the drawings, and practice of the invention. The embodiments and preferred features described above should be considered exemplary, with the invention being defined by the appended claims, which therefore include all such alternatives, modifications, permutations and equivalents as fall within the true spirit and scope of the present invention.

We claim:

1. A system for optical amplification, comprising:
one or more passively wavelength-stabilized pump diodes configured to generate pumping light;
a gain medium comprising a first portion and a second portion, the gain medium configured to receive into the first portion the pumping light near an absorption peak of the gain medium and amplify pulsed laser light coupled into the second portion of the gain medium to a high peak power; and
an output section configured to process the amplified pulsed laser light to result in an ultrashort athermally-ablative pulse of light.

2. The system of claim 1, wherein the gain medium comprises a multimode optical fiber less than about five meters in length.

3. The system of claim 1, wherein the gain medium comprises a double clad optical fiber, the first portion comprises an outer core of the optical fiber, and the second portion comprises an inner core of the optical fiber.

4. The system of claim 1, wherein the gain medium comprises a double clad optical fiber, the first portion comprises a multimode outer core of the optical fiber, and the second portion comprises an inner core of the optical fiber.

5. The system of claim 1, wherein the gain medium comprises a double clad optical fiber, the first portion comprises an outer core of the optical fiber, and the second portion comprises a multimode inner core of the optical fiber.

6. The system of claim 1, further comprising a volume phase hologram device configured to passively wavelength-stabilize the one or more pump diodes by reflecting a portion of the pumping light back to the one or more pump diodes.

7. The system of claim 6, wherein the one or more pump diodes are coupled into multimode fiber.

8. The system of claim 1, wherein the absorption peak spans a narrower wavelength range than results from a non-wavelength-stabilized temperature drift of the one or more pump diodes.

9. The system of claim 1, wherein the gain medium comprises a rare-earth-ion doped optical fiber.

10. The system of claim 1, wherein the gain medium comprises an optical fiber doped with erbium or ytterbium ions.

11. The system of claim 1, further comprising a volume phase hologram device configured to passively wavelength-stabilize the one or more pump diodes by using a portion of the pumping light.

12. The system of claim 1, wherein the absorption peak of the gain medium spans a first wavelength range narrower than a second wavelength range, the second wavelength range resulting from a temperature or current drift of the one or more non-wavelength-stabilized pump diodes.

13. The system of claim 1 wherein the gain medium comprises a photonic bandgap optical fiber.

14. A pulse amplification system, comprising:
one or more pump diodes configured to generate a pumping light;
a passive optical device configured to wavelength-stabilize the pumping light by reflecting a portion of the pumping light back to the one or more pump diodes;
a laser seed source configured to generate an ultrashort pulsed signal;
a pulse stretcher configured to stretch the ultrashort pulsed signal;
a gain medium configured to amplify the stretched pulsed signal, the gain medium excited by the pumping light near an absorption peak of the gain medium; and
an output stage configured to compress the amplified stretched pulsed signal to result in an ultrashort athermally-ablative pulse of light.

15. The pulse amplification system of claim 14, wherein the passive optical device comprises a volume phase hologram device configured to wavelength-stabilize the one or more pump diodes by reflecting a portion of the pulsed laser light back to the one or more pump diodes.

16. The pulse amplification system of claim 15, wherein the one or more pump diodes are coupled into multimode fiber.

17. A pulse amplification system, comprising:
one or more pump diodes configured to generate a pumping light;
a passive optical device configured to wavelength-stabilize the pumping light using a portion of the pumping light back;
a laser seed source configured to generate a pulsed signal;
a pulse stretcher configured to stretch the pulsed signal to generate a stretched pulsed signal;
a gain medium configured to amplify the stretched pulsed signal, the gain medium excited by the pumping light near an absorption peak of the gain medium; and
a compression stage configured to compress the amplified stretched pulsed signal to generate a compressed pulse of light.

* * * * *